United States Patent [19]
Weller

[11] 3,974,459
[45] Aug. 10, 1976

[54] MILLIMETER WAVEGUIDE OSCILLATOR AND AMPLIFIER STRUCTURE

[75] Inventor: Kenneth P. Weller, Rancho Palos Verdes, Calif.

[73] Assignee: Hughes Aircraft Company, Culver City, Calif.

[22] Filed: June 23, 1975

[21] Appl. No.: 589,107

[52] U.S. Cl. .................................. 331/96; 330/5; 330/34; 330/56; 330/61 A; 331/107 R
[51] Int. Cl.² ...................... H03B 7/14; H03F 3/10; H03F 3/60
[58] Field of Search ............. 331/96, 107 R, 107 G, 331/117 D; 330/5, 34, 56, 61 A

[56] References Cited
UNITED STATES PATENTS
3,913,035  10/1975  Havens ........................... 331/107 R OTHER PUBLICATIONS
Bowers et al., Digest of Technical Papers of the 1973 IEEE International Solid-State Circuits Conference, pp. 48–49, (2-14-73).
Kuno et al., Digest of Technical Papers of the 1973 IEEE International Solid-Circuits Conference, pp. 50–51, (2-14 73).

*Primary Examiner*—Siegfried H. Grimm
*Attorney, Agent, or Firm*—William J. Bethurum; W. H. MacAllister

[57] ABSTRACT

Disclosed is a millimeter wave waveguide structure adapted for operation with negative resistance devices, such as solid state avalanche breakdown diodes, at frequencies up to about 170 GHz or higher. A central portion of the structure is formed by a cylindrical metallic impedance transformer and bias pin which has a major face thereof substantially parallel to a common lower waveguide wall of the structure. A negative resistance device is DC coupled between this common waveguide wall and one edge of the impedance transformer, so that the impedance transformer also provides the required DC bias to the negative resistance device. Other portions of the waveguide structure include a first upper waveguide wall, immediately adjacent one side of the impedance transformer, and this wall, together with the common lower waveguide wall, forms a tuning cavity into which a sliding tuning short is positioned. Another portion of the waveguide structure includes a second, upper waveguide wall immediately adjacent the opposite side of the impedance transformer, and this wall together with the common lower waveguide wall, confines millimeter wave power from the negative resistance device to a predetermined path and direction. Suitable waveguide transition means are coupled to the second upper waveguide wall for coupling the above structure to a full height waveguide.

14 Claims, 3 Drawing Figures

U.S. Patent  Aug. 10, 1976  3,974,459
Fig. 1.
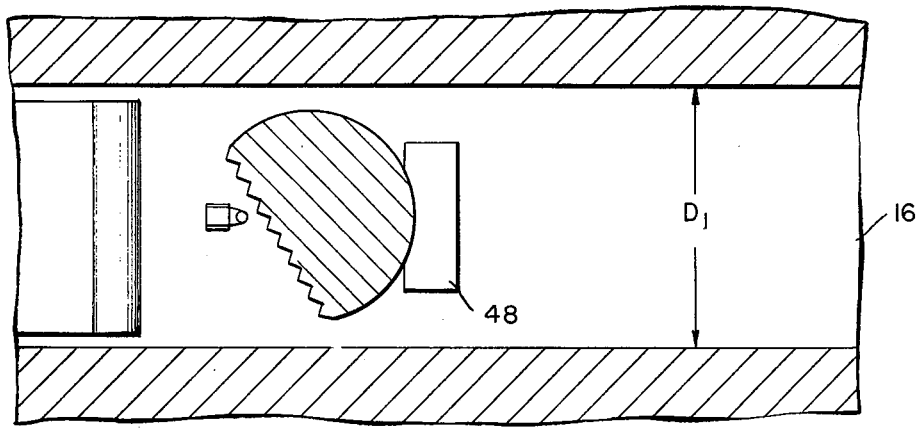
Fig. 3.
Fig. 2.
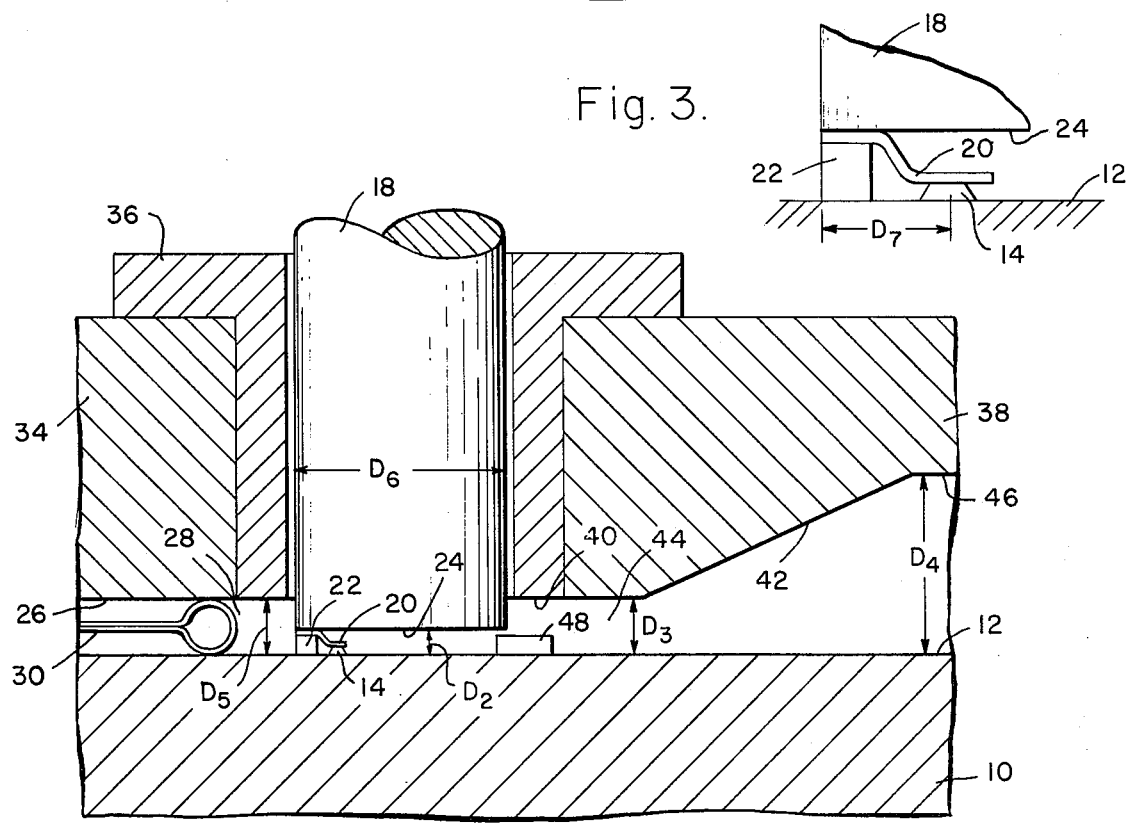

MILLIMETER WAVEGUIDE OSCILLATOR AND AMPLIFIER STRUCTURE

FIELD OF THE INVENTION

This invention relates generally to millimeter wave amplifier and oscillator structures and more particularly to a novel waveguide structure which may form a sub-section of an amplifier or oscillator structure and which is capable of sustaining millimeter wave propagation at frequencies up to and including 170 GHz.

BACKGROUND

There has been significant interest in recent years in extending the frequency range of millimeter wave oscillators and amplifiers out beyond their present limit, which for example is about 100 GHz for commercial IMPATT oscillators. One of many reasons for extending the frequency capability of these solid state oscillators and amplifiers is to provide, for example, a solid state millimeter wave IMPATT oscillator which may be used as a high frequency pump source for parametric amplifiers and which is capable of operating out beyond 150 GHz. Such a pump source could be used to replace klystron tubes which are presently used for this purpose. Therefore, without elaborating further on the many other possible applications for a solid state amplifier or oscillator capable of operating out beyond 150 GHz, it is obvious that the substantial need the utility of such components are manifest.

PRIOR ART

I know of two prior approaches which have been reported in the literature for extending the frequency capability of negative resistances devices, such as IMPATT diodes, well into the millimeter wave range. The first approach is reported by T. Misawa and N. D. Kenyon, in an article entitled "An Oscillator Circuit with Cap Structures for Millimeter-Wave IMPATT Diode", *IEEE Trans. Microwave Thy. and Techniques*, MTT-18, pp 969–970, Nov. 1970. This reference discloses a structure in which a negative resistance diode is contacted with a bias cap which forms an impedance transforming cavity around the diode. This circuit provides relatively efficient oscillator operation, but is not particularly well suited for stable broadband amplification. Additionally, at frequencies on the order of 150 GHz, the problems of fabricating the bias cap structure to the required dimensions, and mounting the cap structure with the required mechanical rigidity, become extreme and thus make the circuit impractical.

A second approach to the problem of extending the frequency range of state of the art negative resistance devices further into the millimeter wave range is described by H. J. Kuno, T. T. Fong and D. L. English in an article entitled "Characterization of IMPATT Diodes at Millimeter Wave Frequencies", *IEEE Trans. on Electron Devices*, ED-19, pp 752–757, June 1972. This reference discloses a reduced height waveguide circuit which includes a bias choke section of waveguide with a tunable series inductance. However, it is believed that relative to the present invention, the complexity of this prior circuit results in unnecessary power losses. Additionally, the scaling of the reduces height dimension of the above Kuno et al waveguide circuit from that used at 60 GHz to that required for 150 GHz becomes impractical and also makes it difficult to provide adequate impedance matching at this higher frequency.

THE INVENTION

One general purpose of the present invention is to provide a novel waveguide structure capable of operation with negative resistance semiconductor devices at frequencies up to and including 170 GHz. Another general purpose is to provide a circuit of the type described which overcomes the above identified electrical, mechanical and fabrication limitations of the waveguide circuits reported in the above two prior art references. At the same time, the present invention possesses most, if not all, of the significant advantages of these two prior approaches and provides a stable broadband source of millimeter wave oscillations.

To accomplish these purposes, I have developed a waveguide structure which includes a common lower waveguide and support member having one major surface for receiving and supporting a negative resistance device and for confining the millimeter wave propagation therefrom. The structure embodying my invention further includes a cylindrical impedance transforming member with an end face thereof substantially parallel with the above major surface of the waveguide and support member and spaced therefrom by a predetermined distance. The negative resistance device is mounted between one edge of the end face of the impedance transformer and the supporting surface of the waveguide and support member. Thus, the impedance transformer provides DC bias for the negative resistance device as well as the necessary impedance transformation between the device and adjacent waveguiding structure for millimeter waves propagated therefrom.

A first waveguide wall adjacent the impedance transformer and facing the waveguide and support member provides a cavity into which a movable tuning member is positioned. A second waveguide wall on the opposite side of the impedance transformer, and also facing the major surface of the waveguide and support member, confines millimeter wave propagation from the negative resistance device along a predetermined path to a waveguide transition surface for wave propagation therefrom to a chosen external circuit.

Accordingly, it is an object of the present invention to provide a new and improved waveguide circuit and structure for a negative resistance device and operable up to millimeter wave frequencies on the order of 170 GHz or higher.

Another object is to provide a waveguide circuit and structure of the type described which is relatively easy to fabricate and which requires a very minimum of machined parts.

Another object is to provide a waveguide circuit and structure of the type described which exhibits a minimum of both parasitic capacitance and leakage currents.

A feature of this invention is the provision of waveguide circuit and structure wherein a cylindrical impedance transformer for a negative resistance device is also used as a conductor of DC bias for this device.

Another feature is the provision of a waveguide circuit and structure of the type described which operates equally well with both reduced stepped height and tapered waveguide transition sections.

These and other objects and features of the invention will become more readily apparent in the following description of the drawing.

DRAWING

FIG. 1 illustrates, in a partially sectioned plan view, the novel waveguide and cavity structure according to the invention.

FIG. 2 illustrates, in a partially sectioned elevational view, the novel waveguide and cavity structure according to the invention.

FIG. 3 is a greatly enlarged view of the the IMPATT diode's DC connection of FIG. 2.

DESCRIPTION OF PREFERRED EMBODIMENT

Referring now to FIGS. 1 and 2, there is shown a waveguide and support member 10 having an upwardly facing support surface 12 for receiving, among other things, an impact avalanche transit time (IMPATT) diode 14. Typically, the waveguide and support member 10 is a copper slab which has the necessary heat sinking properties required for the dissipation of heat generated by the negative resistance IMPATT device 14. The IMPATT diode 14 is mounted at a chosen location (to be described) on the upper surface 12 of the waveguide and support member 10 and in the center of a waveguide slot 16 whose width dimension is defined as $D_1$. The IMPATT diode 14 makes DC connection to a DC bias pin 18 by means of a thin gold ribbon 20 which extends upwardly from the diode 14 to the top surface of a quartz block 22.

The quartz block 22 provides the necessary mechanical rigidity between the DC bias pin 18 and the waveguide surface 12, and eliminates the necessity for positioning the IMPATT diode 14 directly between the bias pin 18 and the waveguide surface 12. Thus, the gold ribbon 20 provides a DC operating voltage to the top side of the IMPATT diode 14, and the bottom side of the IMPATT diode 14 is returned to the DC operating voltage supply through the waveguide member 12. Also, as is noted below, the optimum operational performance for the structure is obtained when the vertical centerline of the IMPATT diode 14 is spaced no more than 0.007 inch from the left hand edge of the DC bias pin 18. But preferably, the diode 14 should be spaced even closer to the edge of pin 18 than 0.007, inch the latter spacing ($D_7$ in FIG. 3) being limited of course by the size and physical tolerances of the quartz block 22 and the gold ribbon 20.

The DC bias pin 18 is also an impedance transforming means for the IMPATT diode 14 and is constructed in the form of a cylindrical conductive pin which makes physical and electrical contact to the left top portion of the gold ribbon 20. In this manner, the DC bias pin 18 not only provides suitable operating bias for the IMPATT diode 14, but it also serves to transform the impedance of the diode 14 by means of its flat end face 24. The end face 24 of the DC bias pin 18 is separated from the major waveguide surface 12 by a dimension $D_2$, and the exact value of this dimension $D_2$, as well as the exact values (or ranges) of all of the dimensions $D_1$ through $D_6$ are dependent upon the desired operating frequency for the structure, as is shown in the table given below.

The waveguide structure in FIGS. 1 and 2 further includes a first upper waveguide wall 26 which is spaced from the waveguide surface 12 by an amount sufficient to form a cavity 28 into which a moveable tuning short 30 is positioned. The waveguide wall 26 is formed partially by the first upper waveguide member 34, which is typically a brass slab, and also partially by a section of a coaxial DC bias isolation sleeve 36. The sleeve 36 may advantageously be fabricated with an anodized coating thereon so as to provide suitable and necessary DC isolation between the DC bias pin 18 and the first and second upper waveguide members 34 and 38. The second upper waveguide member 38 forms, together with section of the DC isolation sleeve 36, a second waveguide wall 40 which is spaced from the waveguide surface 12 by a dimension $D_3$. The ratio $D_2/D_3$ ranges typically between 0.2 and 0.5 for an operational frequency range of between 75 and 200 GHz.

The second upper waveguide member 38 further includes a tapered wall portion 42 which serves as a waveguide transition means for impedance matching the intermediate waveguide region 44 to an external load. The right hand end section 46 of the second upper waveguide member 38 is separated from the waveguide surface 12 by a dimension $D_4$, the values for which are also given in the table below. The dimensions $D_5$ and $D_6$ indicate respectively the height of the tuning cavity 28 and the diameter of the DC bias pin 18. These two dimensions are also given in the tables below and in their relation to a desired frequency range of operation for the waveguide structure disclosed.

The structure in FIGS. 1 and 2 further includes a movable tuning block 48, which is positioned as shown at the right hand edge of the DC bias pin 18. The block 48 may be moved laterally toward and away from the IMPATT diode 14 in order to provide precise frequency tuning of the structure.

Referring now to FIG. 3, it has been noted previously that, preferably, the dimension $D_7$ should be no greater than about 0.007 inches, and that where the physical tolerances of the quartz block 22 and the gold ribbon 20 permit, the value of $D_7$ can be reduced down to about 0.002 inches. Experimentation with the above described waveguide structure has shown that a maximum power output is obtained from port 46 when the IMPATT diode 14 is nearest the edge of the DC bias pin 18. When the IMPATT diode 14 and its associated components 20 and 22 were moved toward the central longitudinal axis of the DC bias pin 18, the power output from the structure was substantially decreased. Specifically, when the waveguide structure was operated with the parameter $D_7$ less than about 0.007 inches, a relatively clean, noise-free output signal of approximately 50 milliwatts was obtained when operating in the 135 GHz – 140 GHz frequency range. When the IMPATT diode 14 and associated components 20 and 22 were moved toward the central longitudinal axis of the DC bias pin 18, the power output from the waveguide output port 46 was decreased to approximately 20 milliwatts, and the measured output signal exhibited relatively large amounts of noise. During the above power measurements, as the IMPATT diode 14 was moved across the entire width $D_6$ of the DC bias pin 18, the frequency of the output signal did not vary. Therefore, the dimension $D_7$ is not considered to be a frequency-dependent parameter of the above described waveguide structure.

One frequency-dependent maximum power output achieved to date using the above described waveguide structure has been approximately 80 milliwatts or greater in the frequency range 136 GHz – 137 GHz, whereas the maximum power output for the maximum operational frequency of about 170 GHz has been approximately 28 milliwatts.

Thus, there has been described a millimeter wave waveguide structure suitable for either oscillation or amplification in conjunction with negative resistance devices at frequencies to and beyond 170 GHz. This structure features a multipurpose impedance transforming DC bias pin 18 which serves not only to provide operating bias for the IMPATT diode 14, but also to provide the appropriate impedance transformation for this diode and for impedance matching between the diode 14 and the intermediate waveguide section 44. Additionally, the utilization of the DC bias pin 18 in the configuration shown and in combination with the DC isolation sleeve 36 is highly compatible from a manufacturing standpoint, especially with the use of the first and second upper waveguide members 34 and 38, which themselves are multifunctional in operation. That is, the upper waveguide member 34 forms, with the waveguide and suport member 10, a necessary tuning cavity 28 into which a moveable tuning member 30 is positioned. Additonally, the upper waveguide member 38 serves not only to confine wave propagation from the diode 14 in a predetermined path and direction, but the intermediate wave propagation section 44 defined in part by a wall of the upper waveguide member 38 serves also to match the impedance of the DC bias pin 18 to the impedance of both the tapered waveguide wall section 42 and the full height waveguide section 46.

The relationship between the operating frequency, $f$, of the above described structure, and the dimension $D_1$ can be expressed by the relation:

$$\frac{c}{2D_1} < f < \frac{c}{D_1}$$

where $c$ is the speed of light. For the usual case of an air filled waveguide this becomes $$\frac{5.91 \text{ GHz}}{D_1 \text{ (inches)}} < f < \frac{11.81 \text{ GHz}}{D_1 \text{ (inches)}}$$

The range of dimensions $D_3$ to $D_6$ can be most easily expressed in terms of the dimension $D_1$. Table I below indicates a typical range of dimensions which have been found experimentally to be useful.

TABLE I

| Dimension | Range of Ratio to "$D_1$" |
|---|---|
| $D_1$ | 1 |
| $D_3$ | 0.1 – 0.3 |
| $D_4$ | 0.4 – 0.5 |
| $D_5$ | 0.1 – 0.3 |
| $D_6$ | 0.25 – 0.75 |

The dimension $D_2$ is related to the dimension $D_3$, typically in the ration $D_2/D_3$ of 0.2 to 0.5. For convenient reference, a table of typical dimensions used in the upper millimeter frequency range is provided in Table II below.

TABLE II

| Dimensions (Milli-inches) | FREQUENCY RANGE (GHz) | | | |
|---|---|---|---|---|
| | 75 – 100 | 90 – 130 | 110 – 150 | 140 – 200 |
| $D_1$ | 100 | 80 | 65 | 51 |
| $D_2$ | 2–15 | 2–12 | 2–10 | 2–8 |
| $D_3$ | 10–30 | 10–24 | 10–20 | 10–15 |
| $D_4$ | 50 | 40 | 32.5 | 25.5 |
| $D_5$ | 10–30 | 10–24 | 10–20 | 10–15 |
| $D_6$ | 25–75 | 20–60 | 16–49 | 12–38 |

Various modifications may be made to the above disclosed structure without departing from the true scope of my invention. For example, it is not absolutely necessary that the IMPATT diode 14 and its associated components 20 and 22 be mounted as shown on the left-hand edge of the DC bias pin 18. Instead, these components 14, 20 and 22 may be moved over to the right-hand edge of the DC bias pin 18, and in this alternative structural modification, the quartz block 22 would be positioned right at the right-hand edge of the DC bias pin 18, with the IMPATT diode 14 positioned to the left of the quartz block 22 by a dimension corresponding to the previously described dimension $D_7$. In this alternative embodiment, the tuning block 48 will be removed, since this tuning block is not necessary to the operation of the invention. The tuning block 48 has been used merely to maximize the power output of the disclosed waveguide structure, and for this reason it is preferred that the IMPATT diode 14 and associated components 20 and 22 be mounted as shown at the left-hand edge of the DC bias pin and impedance transforming member 18.

What is claimed is:

1. A waveguide structure adapted for operation with negative resistance devices at frequencies up to 170 GHz or higher, including in combination:
   a. a waveguide and support member having one major surface thereof for confining wave propagation along a predetermined path and direction,
   b. a negative resistance device supported by said member at a chosen location on said major surface,
   c. impedance transforming means having an end surface thereof facing said one major surface of said waveguide and support member and in electrical contact with said negative resistance device at one edge of said end surface, said end surface and said major surface of said waveguide and support member being separated in substantially parallel planes by a predetermined distance sufficient to produce a corresponding predetermined impedance transformation between said negative resistance device and an adjacent waveguide,
   d. a first waveguide wall adjacent one side of said impedance transforming means and spaced from said waveguide and support member by a predetermined distance sufficient to form a tuning cavity into which a moveable tuning member is received, said first waveguide wall providing an impedance match between said negative resistance device and said tuning member,
   e. a second waveguide wall adjacent another side of said impedance transforming means and spaced from said waveguide and support member by a predetermined distance, said second waveguide wall and said waveguide and support member forming an intermediate closed waveguide section whose impedance matches the impedance of said transforming means to the impedance of an adjacent waveguide transition means, and f. said waveguide transition means joined to said intermediate waveguide section for coupling electromagnetic energy from said negative resistance device to an external load.

2. The structure defined in claim 1 wherein said first and second waveguide walls have a chosen width dimension, $D_1$, related to the frequency of operation, $f$, of said structure by the expression $$\frac{c}{2D_1} < f < \frac{c}{D_1}$$

where c is the speed of light.

3. The structure defined in claim 2 wherein said predetermined distance between said end surface of said impedance transforming means and said major surface of said waveguide and support member is defined as dimension $D_2$, and said predetermined distance between said second waveguide wall and said major surface of said waveguide and support member is defined as dimension $D_3$, and the ratio $D_2/D_3$ being in the range of 0.2–0.5.

4. The structure defined in claim 3 wherein said waveguide transition means has a full height dimension $D_4$, said predetermined distance between said first waveguide wall and said major surface of said waveguide and support member having a dimension $D_5$, and said impedance transforming means having a diameter dimension $D_6$, with the ratio of $D_3/D_1$ being between 0.1 and 0.3, the ratio of $D_4/D_1$ being between 0.4 and 0.5, the ratio of $D_5/D_1$ being between 0.1 and 0.3, and the ratio of $D_6/D_1$ being between 0.25 and 0.75.

5. The structure defined in claim 1 wherein each of said first and second waveguide walls is partially formed by a cylindrical hollow DC isolation member mounted coaxial with said impedance transforming means and being sufficiently insulative to DC isolate said impedance transforming means and the remainder of said first and second waveguide walls.

6. The structure defined in claim 1 wherein said negative resistance device is an impact avalanche transit time (IMPATT) diode.

7. The structure defined in claim 1 which further includes a moveable tuning block positioned on said waveguide and support member at a predetermined distance from another edge of of said impedance transforming means for frequency tuning said structure.

8. The structure defined in claim 6 wherein each of said first and second waveguide walls is partially formed by a cylindrical hollow DC isolation member adjacent and coaxial with said impedance transforming means for providing DC isolation between said impedance transforming means and the remaining portions of said first and second waveguide walls.

9. The structure defined in claim 8 which further includes a moveable tuning block positioned at a chosen location on said waveguide and support member and closely adjacent the one edge of said impedance transforming means for providing frequency tuning for said structure.

10. The structure defined in claim 8 wherein said impedance transforming means is a conductive cylinder of one piece construction which is relatively easy to machine and multifunctional in its purpose.

11. A waveguide structure operative with negative resistance devices at frequencies up to 170 GHz or higher including in combination:
 a. a waveguiding member having one major surface thereof for confining wave propagation along a predetermined path and direction,
 b. a negative resistance device supported by said waveguiding member at a chosen location on said major surface,
 c. a conductive impedance transforming member having an end surface facing said waveguiding member and connecting said negative resistance device adjacent one edge of said end surface, so that the remainder of said end surface serves to transform the impedance of said negative resistance device by a predetermined amount,
 d. a waveguide wall adjacent both one side of said impedance transforming means and said negative resistance device, said waveguide wall forming, with said major surface of said waveguide member, a tuning cavity of predetermined height into which a moveable tuning member is received, and
 e. impedance matching and waveguide transition means positioned on the opposite side of said impedance transforming member for coupling electromagnetic energy from said negative resistance device to an external load.

12. The structure defined in claim 11 wherein said waveguide wall and said impedance matching and waveguide transition means have a chosen width dimension, $D_1$, related to the frequency of operation, $f$, of said structure by the expression $$\frac{c}{2D_1} < f < \frac{c}{D_1}$$

where c is the speed of light.

13. The structure defined in claim 12 wherein a predetermined distance between said end surface of said impedance transforming member and said major surface of said waveguiding member is defined as dimension $D_2$, and the distance between one wall of said impedance matching means and said major surface of said waveguiding member being defined as dimension $D_3$, and the ratio $D_2/D_3$ being in the range of 0.2–0.5.

14. The structure defined in claim 13 wherein said waveguide transition means has a full height dimension $D_4$, the height of said cavity being defined as dimension $D_5$, and said impedance transforming member having a diameter dimension $D_6$, with a ratio of $D_3/D_1$ being between 0.1 and 0.3, the ratio of $D_4/D_1$ being between 0.4 and 0.5, the ratio of $D_5/D_1$ being between 0.1 and 0.3, and the ratio of $D_6/D_1$ being between 0.25 and 0.75.

* * * * *